(12) United States Patent
Tan et al.

(10) Patent No.: US 9,263,132 B2
(45) Date of Patent: Feb. 16, 2016

(54) DOUBLE GATED FLASH MEMORY

(75) Inventors: Shyue Seng Tan, Singapore (SG); Eng Huat Toh, Singapore (SG); Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 475 days.

(21) Appl. No.: 13/206,780

(22) Filed: Aug. 10, 2011

(65) Prior Publication Data

US 2013/0037877 A1    Feb. 14, 2013

(51) Int. Cl.
| | |
|---|---|
| *H01L 21/336* | (2006.01) |
| *G11C 16/04* | (2006.01) |
| *H01L 21/28* | (2006.01) |
| *H01L 29/423* | (2006.01) |
| *H01L 29/66* | (2006.01) |
| *H01L 29/788* | (2006.01) |
| *H01L 27/115* | (2006.01) |

(52) U.S. Cl.
CPC ...... *G11C 16/0425* (2013.01); *H01L 21/28273* (2013.01); *H01L 27/11521* (2013.01); *H01L 29/42328* (2013.01); *H01L 29/66795* (2013.01); *H01L 29/66825* (2013.01); *H01L 29/7881* (2013.01)

(58) Field of Classification Search
CPC ............ H01L 27/1211; H01L 27/0886; H01L 27/10826; H01L 29/7831; H01L 2029/786; H01L 2924/13067; H01L 21/28282; H01L 27/11521; H01L 21/28273; H01L 29/42328; H01L 29/66795; H01L 29/7881; H01L 29/66825; H01L 27/0924; H01L 27/11524; H01L 21/42344; H01L 29/66833; H01L 29/788
USPC ...... 257/315, 316, E21.422, E29.3; 438/157, 257, 258

See application file for complete search history.

(56) References Cited

U.S. PATENT DOCUMENTS

| | | | |
|---|---|---|---|
| 7,791,128 B2 | 9/2010 | Doornbos et al. | |
| 2005/0146937 A1* | 7/2005 | Fan et al. | 365/185.17 |
| 2005/0162928 A1* | 7/2005 | Rosmeulen | 365/185.29 |
| 2006/0208307 A1* | 9/2006 | Chang et al. | 257/315 |
| 2007/0090443 A1* | 4/2007 | Choi et al. | 257/314 |
| 2008/0173921 A1* | 7/2008 | Li et al. | 257/311 |
| 2008/0303094 A1* | 12/2008 | Rao et al. | 257/365 |
| 2009/0321836 A1* | 12/2009 | Wei et al. | 257/365 |
| 2010/0320525 A1* | 12/2010 | Nagashima et al. | 257/324 |

FOREIGN PATENT DOCUMENTS

| | | |
|---|---|---|
| CN | 101273441 A | 9/2008 |
| CN | 102077353 A | 5/2011 |
| TW | 200635042 A | 10/2006 |

OTHER PUBLICATIONS

Chinese Office Action for related Chinese Patent Application No. 201210269889.4 dated May 27, 2015, 26 Pages.

* cited by examiner

*Primary Examiner* — Khiem D Nguyen
(74) *Attorney, Agent, or Firm* — Ditthavong & Steiner, P.C.

(57) ABSTRACT

A split gate memory cell is fabricated with a fin structure between a memory gate stack and a select gate. Embodiments include a first channel region under the memory gate stack and a second channel region under the select gate.

9 Claims, 19 Drawing Sheets

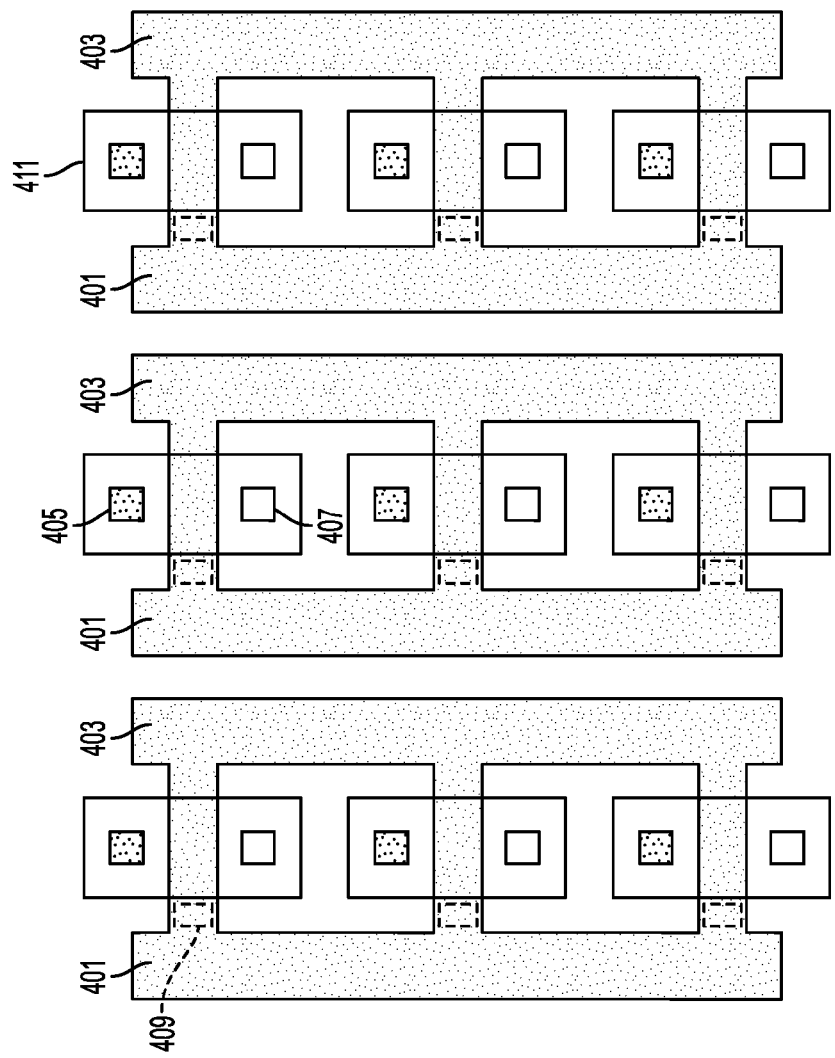
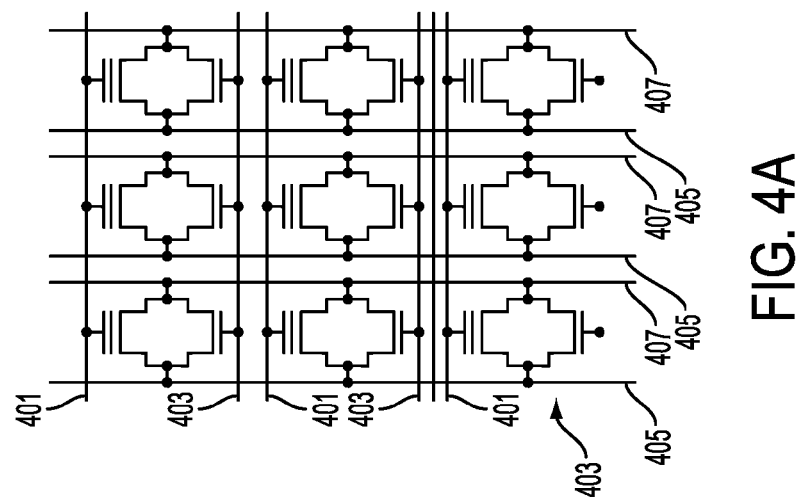
FIG. 4B
FIG. 4A

DOUBLE GATED FLASH MEMORY

TECHNICAL FIELD

The present disclosure relates to flash memory devices with improved data retention and cell endurance. The present disclosure is particularly applicable to flash memory devices for 32 nanometer (nm) technologies and beyond.

BACKGROUND

Split-gate flash technology has been widely employed in medium-low density applications. Conventional split-gate flash memory structures are designed, however, to share the same channel for read, erase, and program (or write) operations, posing severe reliability issues such as data retention and cell endurance. Efforts have been made to enhance data retention and improve endurance characteristics. For example, the structure illustrated in FIG. 1A, including a source region 101, drain regions 103 and 105, trench dielectric 107, channel regions 109 and 111, a floating gate 113, and a control gate 115, utilizes separate channel regions 109 and 111 for reading and programming. As shown in FIGS. 1B and 1C, a read operation employs the left transistor, while a program operation employs the right transistor. Consequently, the structure is less prone to deterioration because no programming stress is applied to the tunneling oxide layer with respect to the channel region designated for reading and, hence, offers better data retention and endurance, as compared with conventional structures.

This approach has proven problematic in several respects. For example, as shown in FIG. 1D, erase operations employ both transistors. As a result, erase and read operations are performed on the same channel, subjecting the reading-designated channel region to erase-induced degradation. The write-designated channel may also experience gate disturbance during read operations, causing undesired data leakage due to stress-induced leakage current (SILC). Additionally, the structure illustrated in FIG. 1A produces a low gate coupling ratio (e.g., $C_{FG}/C_{TOT}$) during programming (e.g., due to dual channels resulting in a rise in $C_{TOT}$), indicating decreased program efficiency.

A need therefore exists for flash memory devices exhibiting enhanced data retention and cell endurance, and for enabling methodology.

SUMMARY

An aspect of the present disclosure is a method of fabricating a memory device exhibiting enhanced data retention and cell endurance.

Another aspect of the present disclosure is a memory device exhibiting enhanced data retention and cell endurance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a fin structure on a substrate; providing a memory gate stack proximate a first side surface of the fin structure; and providing a select gate proximate a second side surface of the fin structure.

Aspects of the present disclosure include: providing a first channel region under the memory gate stack; and providing a second channel region under the select gate. The first channel region may, for instance, be for program and/or erase and the second channel region may be for read.

Another aspect of the present disclosure includes providing the memory gate stack and the select gate on opposite side surfaces of the fin structure. Other aspects of the present disclosure include providing the fin structure by etching the substrate. Embodiments include: etching to form the fin structure having an upper surface; providing the memory gate stack and the select gate stack by: depositing floating gate material on the first side surface of the fin structure; depositing select gate material on the second side surface of the fin structure; planarizing the floating gate material and select gate material to be substantially coplanar with the upper surface of the fin structure; and depositing control gate material proximate a side surface of the floating gate material. Other embodiments include oxidizing the first and second side surfaces of the fin structure prior to depositing the floating gate and select gate material; and forming a dielectric layer on a side surface of the floating gate material prior to depositing the control gate material. In certain embodiments, the floating gate material may be different from the select gate material. In other embodiments, the floating gate material may be the same as the select gate material.

Further aspects of the present disclosure include: providing a second fin structure proximate the select gate; providing a second memory gate stack proximate a side surface of the second fin structure, opposite the select gate. Other aspects include: providing a second memory gate stack on the substrate proximate, but separated from the select gate; providing a second fin structure proximate the second memory gate stack; and providing a second select gate proximate the second fin structure, opposite the second memory gate stack.

An additional aspect of the present disclosure is a device including: a fin structure on a substrate; a memory gate stack proximate a first side surface of the fin structure; and a select gate proximate a second side surface of the fin structure.

Aspects include a device having a first channel region under the memory gate stack and a second channel region under the select gate. The first channel region may, for instance, be for program and/or erase and the second channel region may be for read.

Another aspect of the present disclosure includes a device having the memory gate stack and the select gate on opposite side surfaces of the fin structure. Other aspects include having the memory gate stack comprise: a floating gate proximate the fin structure; and a control gate proximate the floating gate. Embodiments include having an oxide between the select gate and the fin structure and between the floating gate and the fin structure. Other embodiments include having a dielectric layer between the floating gate and the control gate.

Further aspects include a device having: a second fin structure proximate the select gate; and a second memory gate stack proximate a side surface of the second fin structure, opposite the select gate. Other aspects include a device having: a second memory gate stack on the substrate proximate, but separated from the select gate; a second fin structure proximate the second memory gate stack; and a second select gate proximate the second fin structure, opposite the second memory gate stack.

Another aspect of the present disclosure includes: etching a substrate to form a first fin structure and a second fin structure, separated from the first fin structure; forming an oxide over the substrate; timed etching the oxide to expose an upper portion of the first and second fin structures; oxidizing the exposed upper portion of the first and second fin structures; depositing select gate material between oxidized portions of the first and second fin structures, proximate a first side surface of each of the first and second fin structures; depositing floating gate material proximate oxidized portions of a second side surface of each of the first and second fin structures; planarizing the select gate material, floating gate material, and first and second fin structures to be substantially coplanar; forming a first dielectric layer proximate a side surface of the floating gate material proximate the first fin structure and a second dielectric layer proximate a side surface of the floating gate material proximate the second fin structure; and depositing control gate material proximate the first and second dielectric layers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 4A through 4C schematically illustrate a memory array configuration along with associated layouts, in accordance with embodiments of the present disclosure;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of read/program disturbances and cell deterioration attendant upon conventional flash memory devices, notably split-gate flash memory devices. The present disclosure address and solves such problems by, inter alia, providing a fin structure between a memory gate stack and a select gate to separate read operations from program/erase operations. Embodiments include providing a first channel region under the memory gate stack and a second channel region under the select gate. The first channel region may, for instance, be for program and/or erase operations and the second channel region may for be read operations, thereby providing a separate channel for read operations. As a result, data retention and endurance of the device are improved.

Figure 2:
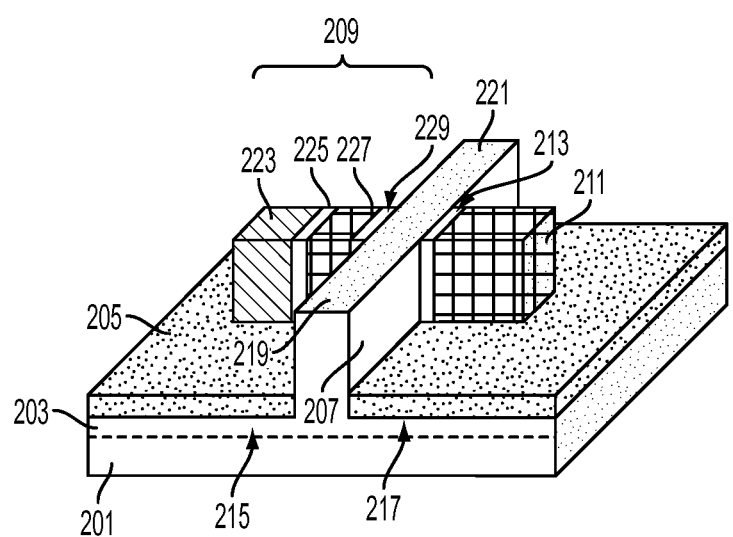
FIGS. 2 and 3 schematically illustrate a three-dimensional view and a two-dimensional view, respectively, of a split-gate structure with a fin structure between a memory gate stack and a select gate, in accordance with an embodiment of the present disclosure.
Figure 3:
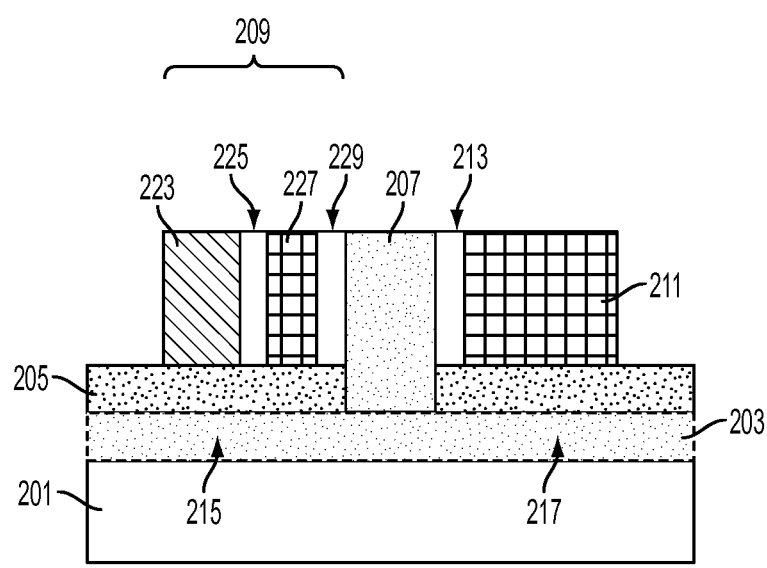

FIG. 2 schematically illustrates a three-dimensional view, and FIG. 3 schematically illustrates a corresponding two-dimensional view, of a split-gate structure with a fin structure between a memory gate stack and a select gate, in accordance with an embodiment of the present disclosure. The split-gate structure shown in FIG. 2 includes a substrate 201, a well 203, a dielectric layer 205, a fin structure 207, a memory gate stack 209, a select gate 211, a first tunneling oxide layer 213, channel regions 215 and 217, a select line 219, and a bit line 221. Memory gate stack 209 comprises a control gate 223, a dielectric layer 225 (e.g., interpoly dielectric), a floating gate 227, and a second tunneling oxide layer 229. Source/drain regions (not shown for illustrative convenience) are located at opposite ends of fin structure 207.

Figure 1A:
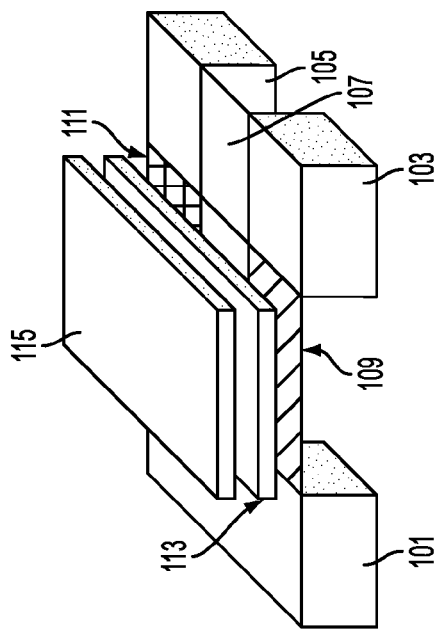
FIGS. 1A through 1D schematically illustrate a background art split-gate non-volatile memory device along with associated circuit diagrams.
Figure 1B:
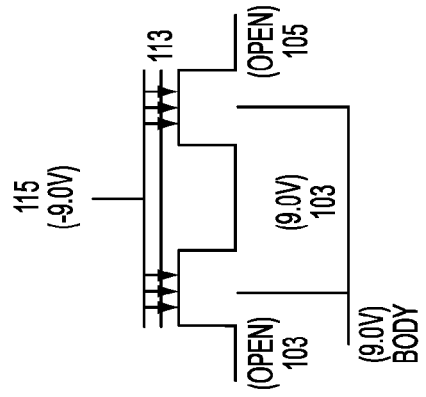
Figure 1C:
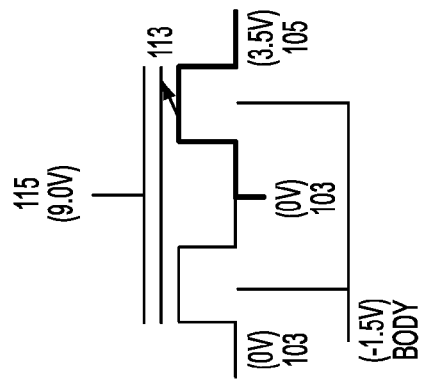
Figure 1D:
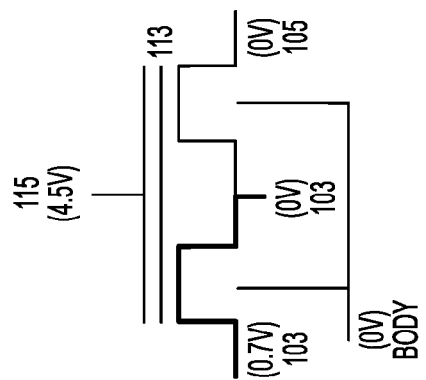

It was found that separating read operations from program/erase operations via separate channels avoids substantial device degradations, such as from oxide density interface trap-induced leakages and mobility degradation. For example, channel region 215 may be the program/erase channel and channel region 217 may be the read channel. As such, the read channel is also isolated from degradation during program/erase operations. In addition, the memory state during read operations will remain unaffected because the interface trap density of the tunneling oxide layer 213 at the program/erase channel remains unfilled (as opposed to being electrically-active). Data leakage from the floating gate 227 is also prevented since read operations are not performed at the program/erase channel, and gate disturbance resulting from read operations is avoided at the program/erase channel. Moreover, program efficiency is increased due to a higher coupling ratio, as compared with the structure in FIG. 1A. Consequently, the structure illustrated in FIGS. 2 and 3 exhibits improved data retention, better endurance characteristics, and increased program efficiency.

Figure 4C:
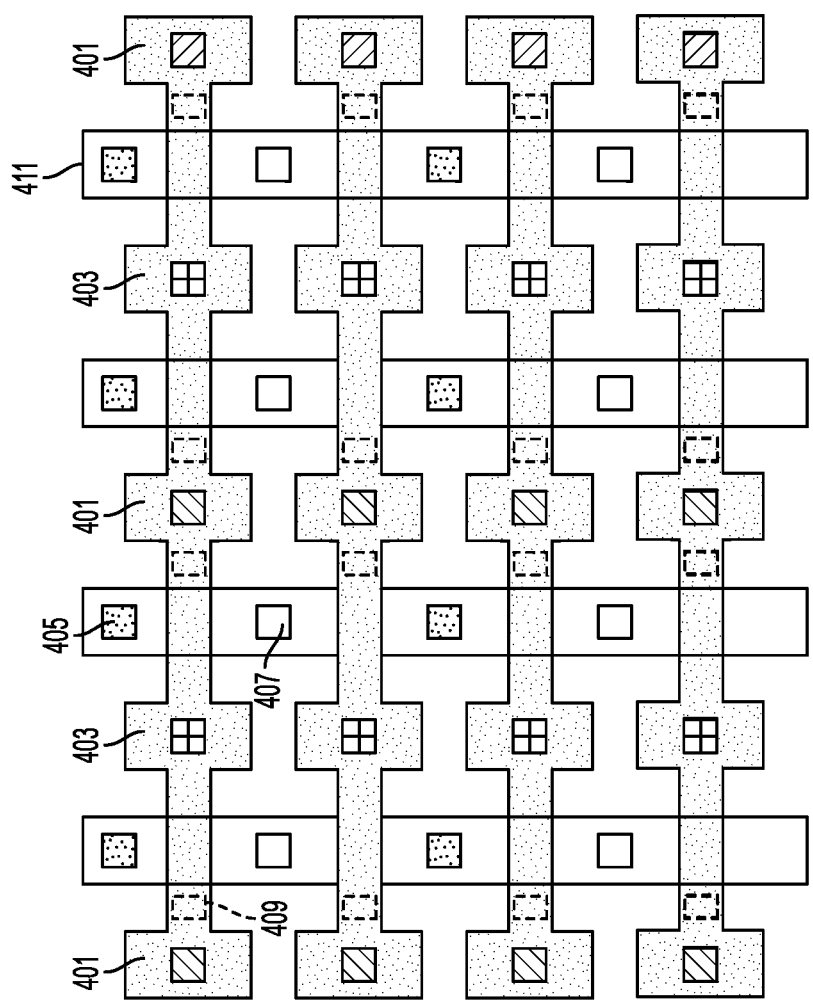

FIGS. 4A and 4C schematically illustrate a memory array configuration along with associated layouts, in accordance with embodiments of the present disclosure. FIG. 4A illustrates the memory array configuration, including control gates 401, select gates 403, source lines 405, and bit lines 407, upon which the layouts in FIGS. 4B and 4C may be based. In the layout illustrated in FIG. 4B, which further includes floating gates 409 and fin structures 411 in addition to the components referenced in FIG. 4A, the select gates 403 are provided as separate nodes, thereby relaxing contact landing requirements. Further, the layout provides for reduced cell size, as compared with conventional designs. In the layout illustrated in FIG. 4C, the select gates 403 are provided as common nodes, offering a more compact design.

Figure 5A:
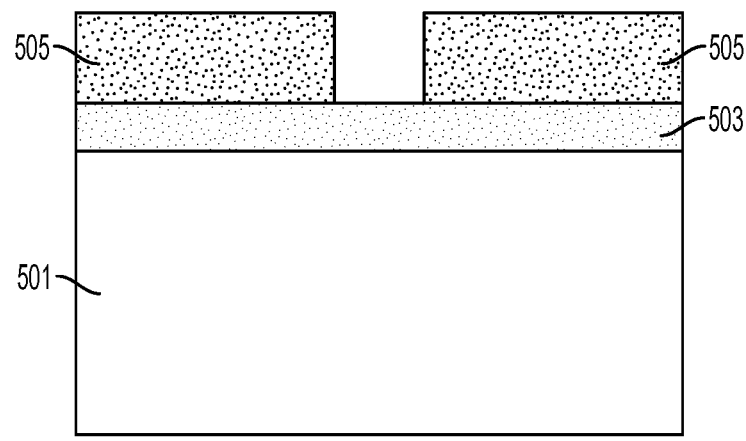
FIGS. 5A through 5K schematically illustrate two-dimensional views of a process flow for providing a split-gate structure with a fin structure between a memory gate stack and a select gate, in accordance with an embodiment of the present disclosure.
Figure 5B:
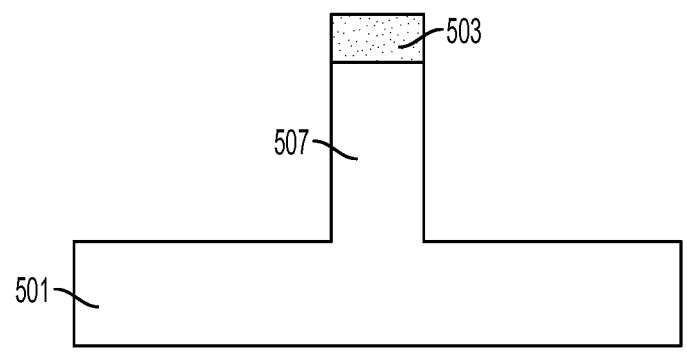
Figure 5C:
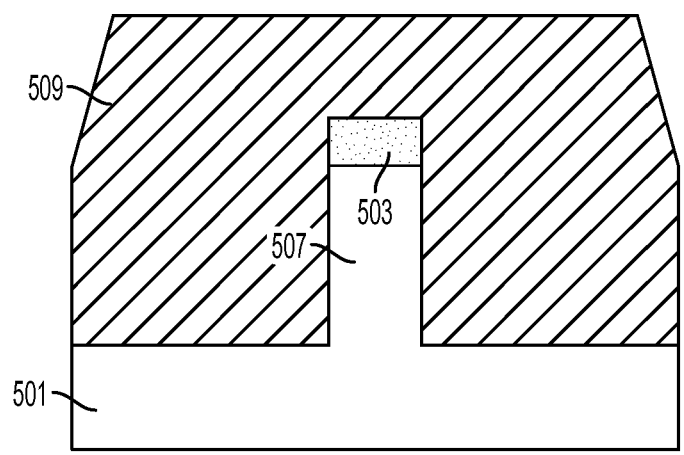
Figure 5D:
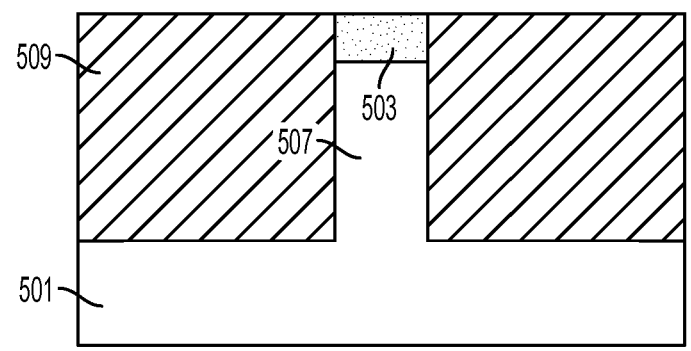

FIGS. 5A through 5K schematically illustrate two-dimensional views of a process flow for providing a split-gate structure with a fin structure between a memory gate stack and a select gate, in accordance with an embodiment of the present disclosure. Adverting to FIG. 5A, hard-mask material (for example silicon nitride) is deposited over a substrate 501 to form a hard-mask layer 503, followed by photoresist patterning to form photoresist patterns 505. FIG. 5B illustrates etching of hard-mask layer 503 and substrate 501 based on photoresist patterns 505 to form a fin structure 507, for example, to a height of 30 nm to 150 nm. FIG. 5C illustrates oxide deposition, for example silicon oxide ($SiO_2$), over substrate 501 to form an oxide layer 509. As illustrated in FIG. 5D, planarization, as by chemical-mechanical polishing (CMP), is performed such that the upper surface of hard-mask layer 503 and oxide layer 509 are substantially coplanar.

Figure 5E:
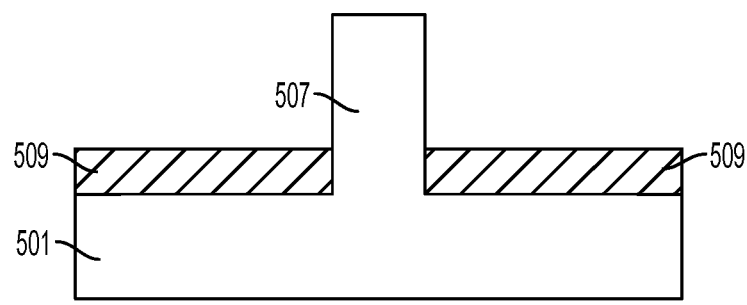
Figure 5F:
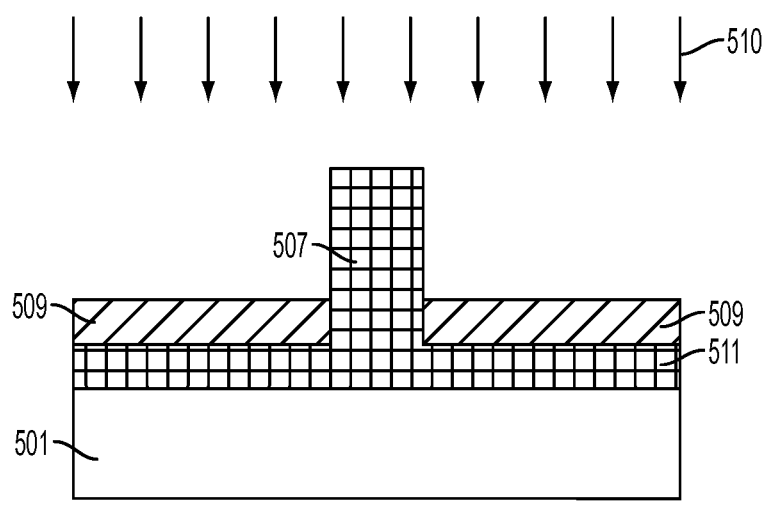
Figure 5G:
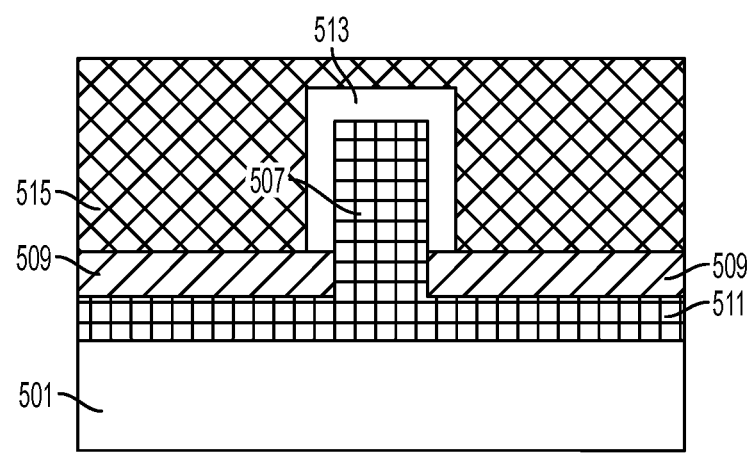
Figure 5H:
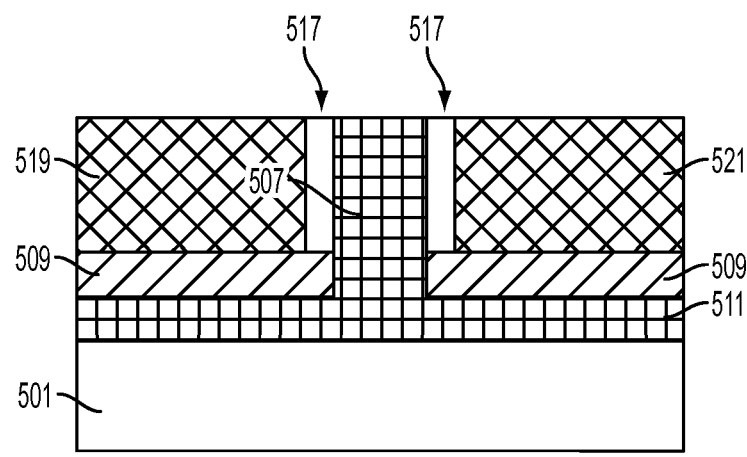

Adverting to FIG. 5E, oxide layer 509 is subsequently timed etched, followed by removal of the hard-mask layer 503. The etching may be performed, for example, by dry/wet etching for 1 min to 20 min. As illustrated in FIG. 5F, standard isolation and well implantation 510 are performed, thereby forming a well 511. As illustrated in FIG. 5G, the fin structure 507 is subsequently oxidized, forming an oxide layer 513 (e.g., $SiO_2$) to a thickness of 60 Å to 150 Å. The oxidation step is followed by depositing floating gate material and select gate material. The floating gate material may be the same as the select gate material (e.g., floating/select gate material 515) (for example polysilicon). As illustrated in FIG. 5H, planarization is again performed, e.g. by CMP, separating the oxide layer 513 into tunneling oxide layers 517 and forming a floating gate 519 and a select gate 521. Moreover, planarization is performed such that the upper surface of fin structure 507, tunneling oxide layers 517, floating gate 519, and select gate 521 are substantially coplanar.

Figure 5I:
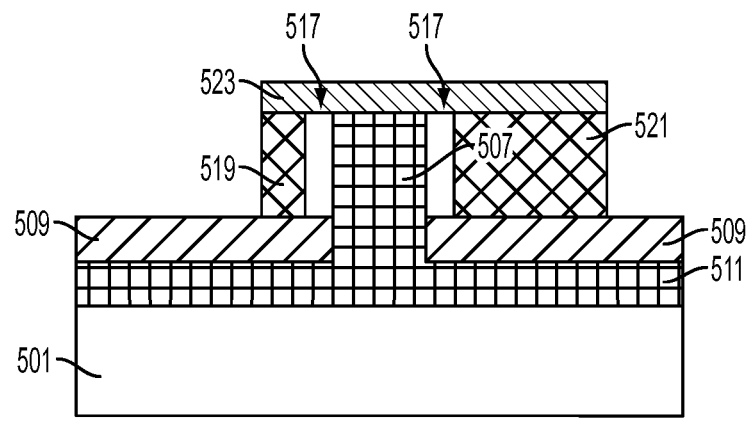
Figure 5J:
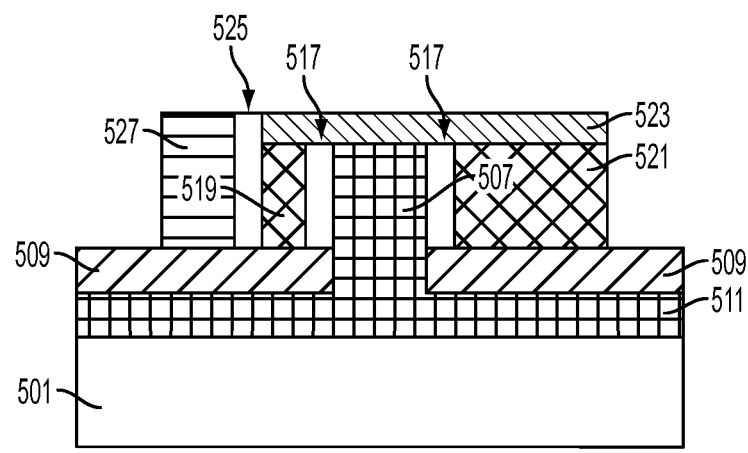
Figure 5K:
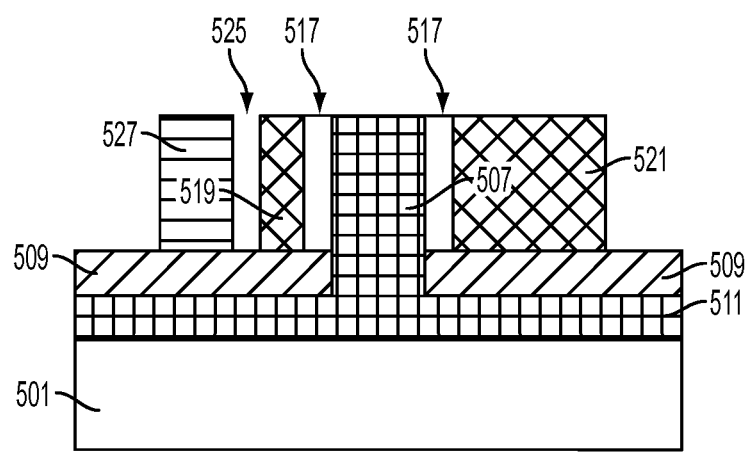
Figure 6A:
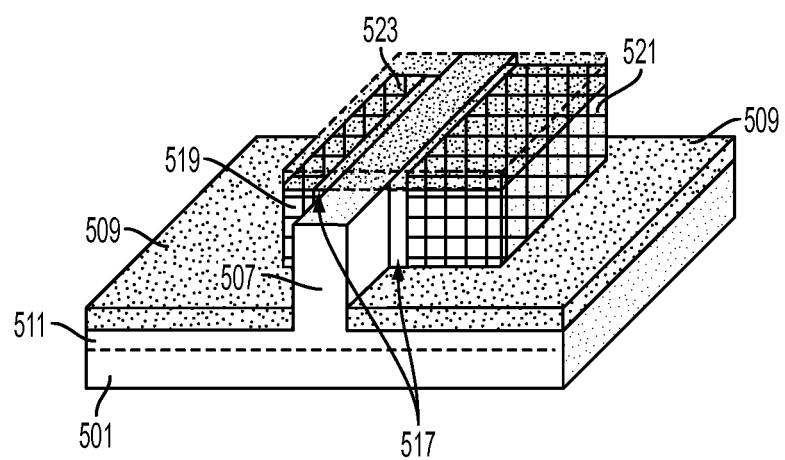
FIGS. 6A through 6C schematically illustrate three-dimensional views corresponding to FIGS. 5I through 5K, respectively.
Figure 6B:
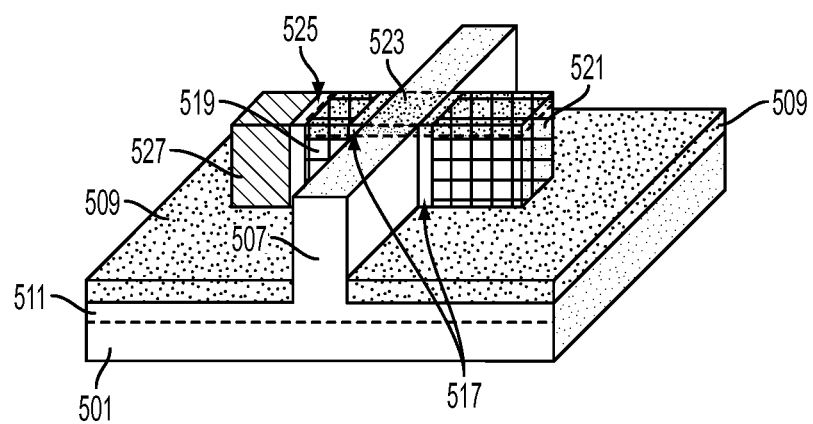
Figure 6C:
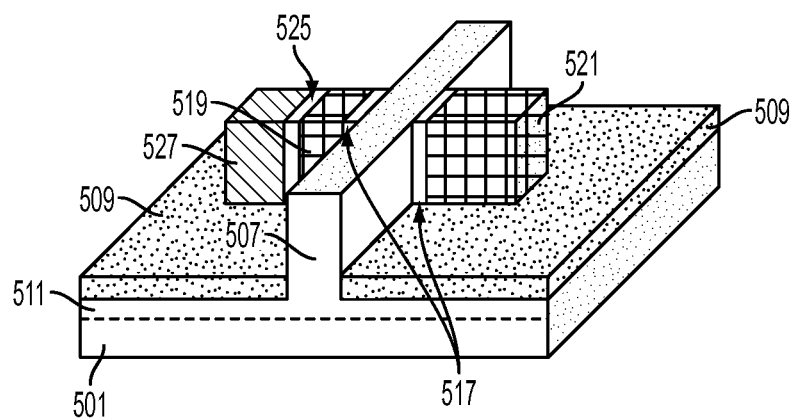

As illustrated in FIG. 5I, hard-mask material and a floating gate mask are deposited, and the hard-mask and floating gate are etched, leaving hard-mask layer 523 and floating gate 519 at a reduced size of 50 nm to 100 nm. FIG. 5J illustrates depositing dielectric material on a sidewall of floating gate 519 to form a dielectric layer 525 (e.g., interpoly dielectric, such as $SiO_2$ or ONO) and depositing control gate material, e.g. polysilicon, proximate to dielectric layer 525. The control gate material is planarized, stopping at hardmask 523 and etched via a mask to form control gate 527. Spacers (not shown for illustrative convenience) may then be formed, and standard source/drain implantation may be performed. FIG. 5K illustrates further steps, such as rapid thermal anneal (RTA) and removal of the hard-mask layer 523, which may be performed in a conventional manner. Conventional processing may then proceed. FIGS. 6A through 6C schematically illustrate three-dimensional views corresponding to FIGS. SI through 5K, respectively.

The embodiments of the present disclosure achieve several technical effects, including enhanced data retention, superior cell endurance, increased program efficiency, and reduced cell size. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   etching to form a fin structure on a substrate;
   depositing a hard mask material on the fin structure;
   forming an oxide over the substrate;
   etching the oxide to expose an upper portion of the fin structure;
   removing the hard mask material;
   performing an isolation and well implantation to form a well;
   providing a memory gate stack and a first tunneling oxide layer along a first side surface of the fin structure; and
   providing a select gate and a second tunneling oxide layer along a second side surface of the fin structure,
   wherein providing the memory gate stack and the select gate stack includes:
   depositing a floating gate material on the first side surface of the fin structure;
   depositing a select gate material on the second side surface of the fin structure;
   planarizing the floating gate material and the select gate material to be substantially coplanar with an upper surface of the fin structure; and
   depositing a control gate material proximate a side surface of the floating gate material,
   wherein an upper surface of the control gate material is substantially coplanar with the upper surface of the fin structure.

2. The method according to claim 1, comprising:
   providing a first channel region under the memory gate stack; and
   providing a second channel region under the select gate.

3. The method according to claim 2, wherein the first channel region is for program and/or erase and the second channel region is for read.

4. The method according to claim 1, comprising providing the memory gate stack and the select gate on opposite side surfaces of the fin structure.

5. The method according to claim 1, wherein the floating gate material is the same as the select gate material.

6. The method according to claim 1, comprising:
   oxidizing the first and second side surfaces of the fin structure prior to depositing the floating gate and the select gate material; and
   forming a dielectric layer on a side surface of the floating gate material prior to depositing the control gate material.

7. The method according to claim 4, comprising:
   providing a second fin structure proximate the select gate; and
   providing a second memory gate stack proximate a side surface of the second fin structure, opposite the select gate.

8. The method according to claim 4, comprising:
   providing a second memory gate stack on the substrate proximate, but separated from the select gate;
   providing a second fin structure proximate the second memory gate stack; and
   providing a second select gate proximate the second fin structure, opposite the second memory gate stack.

9. A method comprising:
   etching a substrate to form a first fin structure and a second fin structure, separated from the first fin structure;
   forming an oxide over the substrate;

timed etching the oxide to expose an upper portion of the first and second fin structures;
oxidizing the exposed upper portion of the first and second fin structures;
depositing a select gate material between oxidized portions of the first and second fin structures, proximate a first side surface of each of the first and second fin structures;
depositing a floating gate material proximate oxidized portions of a second side surface of each of the first and second fin structures;
planarizing the select gate material, the floating gate material, and the first and second fin structures to be substantially coplanar;
forming a first dielectric layer proximate a side surface of the floating gate material proximate the first fin structure and a second dielectric layer proximate a side surface of the floating gate material proximate the second fin structure; and
depositing a control gate material proximate the first and second dielectric layers.

* * * * *